US 6,759,724 B2

United States Patent
Cao et al.

(12) United States Patent
Cao et al.

(10) Patent No.: US 6,759,724 B2
(45) Date of Patent: Jul. 6, 2004

(54) ISOLATION OF ALPHA SILICON DIODE SENSORS THROUGH ION IMPLANTATION

(75) Inventors: Min Cao, Mountain View, CA (US); Jeremy A. Theil, Mountain View, CA (US); Gary W. Ray, Mountain View, CA (US); Dietrich W. Vook, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 51 days.

(21) Appl. No.: 10/349,447

(22) Filed: Jan. 22, 2003

(65) Prior Publication Data

US 2003/0107100 A1 Jun. 12, 2003

Related U.S. Application Data

(63) Continuation of application No. 09/290,443, filed on Apr. 13, 1999.

(51) Int. Cl.[7] ............................................... H01L 31/20
(52) U.S. Cl. ........................... 257/443; 257/59; 257/72
(58) Field of Search .............................. 257/53, 59, 72, 257/434, 443–444, 446, 457–459, 448, 449

(56) References Cited

U.S. PATENT DOCUMENTS

| | | | | |
|---|---|---|---|---|
| 5,936,261 A | * | 8/1999 | Ma et al. | 257/59 |
| 5,985,689 A | * | 11/1999 | Gofuku et al. | 438/59 |
| 6,034,431 A | * | 3/2000 | Goosen et al. | 257/750 |

FOREIGN PATENT DOCUMENTS

| | | |
|---|---|---|
| EP | 58154961 | 8/1983 |
| EP | 01009957 | 7/1990 |
| EP | 0494694 A | 7/1992 |

* cited by examiner

*Primary Examiner*—Minhloan Tran
*Assistant Examiner*—Thomas L Dickey

(57) ABSTRACT

An image sensor. The image sensor array includes a substrate. An interconnect structure is formed adjacent to the substrate. An amorphous silicon electrode layer is adjacent to the interconnect structure. The amorphous silicon electrode layer includes electrode ion implantation regions between pixel electrode regions. The pixel electrode regions define cathodes of an array of image sensors. The electrode ion implantation regions provide physical isolation between the pixel electrode regions. The cathodes are electrically connected to the interconnect structure. An amorphous silicon I-layer is adjacent to the amorphous silicon electrode layer. The amorphous silicon I-layer forms an inner layer of each of the image sensors. A transparent electrode layer is formed adjacent to the image sensors. An inner surface of the transparent electrode is electrically connected to anodes of the image sensors and the interconnect structure. The amorphous silicon I-layer region can further include I-layer ion implantation regions that provide physical isolation between the inner layers of the image sensors. The I-layer ion implantation regions align with the electrode ion implantation regions. An amorphous silicon P-layer can be formed adjacent to the amorphous silicon I-layer. The amorphous silicon P-layer forms an outer layer of each of the image sensors. The amorphous silicon P-layer region can include P-layer ion implantation regions that provide physical isolation between the outer layers of the image sensors.

32 Claims, 7 Drawing Sheets

ISOLATION OF ALPHA SILICON DIODE SENSORS THROUGH ION IMPLANTATION

This is a continuation of co-pending application Ser. No. 09/290,443, filed on Apr. 13, 1999, the entire disclosure of which is incorporated herein by reference.

FIELD OF INVENTION

This invention relates generally to PIN photo diode image sensors. In particular, it relates to a plurality of elevated PIN diode image sensors in which the diode image sensor are physically isolated from each other by ion implantation regions.

BACKGROUND

An array of image sensors or light sensitive sensors detect the intensity of light received by the image sensors. The image sensors typically generate electronic signals that have amplitudes that are proportionate to the intensity of the light received by the image sensors. The image sensors can convert an optical image into a set of electronic signals. The electronic signals may represent intensities of colors of light received by the image sensors. The electronic signals can be conditioned and sampled to allow image processing.

Integration of the image sensors with signal processing circuitry is becoming more important because integration enables miniaturization and simplification of imaging systems. Integration of image sensors along with analog and digital signal processing circuitry allows electronic imaging systems to be low cost, compact and require low power consumption.

Historically, image sensors have predominantly been charged coupled devices (CCDs). CCDs are relatively small and can provide a high-fill factor. However, CCDs are very difficult to integrate with digital and analog circuitry. Further, CCDs dissipate large amounts of power and suffer from image smearing problems.

An alternative to CCD sensors are active pixel sensors. Active pixel sensors can be fabricated using standard CMOS processes. Therefore, active pixel sensors can easily be integrated with digital and analog signal processing circuitry. Further, CMOS circuits dissipate small amounts of power.

FIG. 1 shows a cross-section of a prior art array of image sensors. This array of image sensors includes PIN diode sensors located over a substrate 10. An interconnection structure 12 electrically connects an N-layer 14 of the PIN diodes to the substrate 10. An I-layer 16 is formed over the N-layer 14. A P-layer 18 is formed over the I-layer 16. The P-layer 18, the I-layer 16 and the N-layer 14 form the array of PIN diode sensors. A first conductive via 20 electrically connects a first diode sensor to the substrate 10, and a second conductive via 22 electrically connects a second diode sensor to the substrate 10. A transparent conductive layer 24 is located over the array of diode sensors. A conductive lead 26 is connected to the transparent conductive layer 24. The conductive lead 26 is connected to a bias voltage which allows biasing of the P-layer 18 of the array of PIN diode sensors to a selected voltage potential.

A limitation of the image sensor structure of FIG. 1 is that the individual image sensors are not isolated from each other. That is, light received by a given image sensor effects neighboring image sensors because current can flow through the N-layer 14 between neighboring image sensors. Charge flows between the image sensors particularly when the light intensity of the received light varies greatly between neighboring image sensors. The P-layer 18, the I-layer 16 and the N-layer 14 are shared by neighboring image sensors. A trench 28 is formed to provide some isolation between the image sensors by increasing the resistance between the N-layers sections of neighboring image sensors.

It is desirable to have a plurality of active pixel sensors formed adjacent to a substrate in which the pixel sensors are isolated from each other to reduce coupling between the pixel sensors. It is desirable that the process required to form the isolated pixel sensor be easy to implement.

SUMMARY OF THE INVENTION

The invention includes an array of image sensors formed adjacent to a substrate. The array includes ion implantation regions located between the image sensors. The ion implantation regions provide physical isolation between image sensors. The physical isolation reduces coupling and crosstalk between the image sensors. The array of isolated image sensors can be formed by a simple fabrication process.

A first embodiment includes an image sensor array. The image sensor array includes a substrate. An interconnect structure is formed adjacent to the substrate. An amorphous silicon electrode layer is adjacent to the interconnect structure. The amorphous silicon electrode layer includes electrode ion implantation regions between pixel electrode regions. The pixel electrode regions define cathodes of an array of image sensors. The electrode ion implantation regions provide physical isolation between the pixel electrode regions. The cathodes are electrically connected to the interconnect structure. An amorphous silicon I-layer is adjacent to the amorphous silicon electrode layer. The amorphous silicon I-layer forms an inner layer of each of the image sensors. A transparent electrode layer is formed adjacent to the image sensors. An inner surface of the transparent electrode is electrically connected to anodes of the image sensors and the interconnect structure.

A second embodiment is similar to the first embodiment. The amorphous silicon I-layer region of the second embodiment includes I-layer ion implantation regions that provide physical isolation between the inner layers of the image sensors. The I-layer ion implantation regions align with the electrode ion implantation regions.

A third embodiment is similar to the first embodiment. The third embodiment includes an amorphous silicon P-layer adjacent to the amorphous silicon I-layer. The amorphous silicon P-layer forms an outer layer of each of the image sensors.

A fourth embodiment is similar to the third embodiment. The amorphous silicon P-layer region of the fourth embodiment includes P-layer ion implantation regions that provide physical isolation between the outer layers of the image sensors.

Other aspects and advantages of the present invention will become apparent from the following detailed description, taken in conjunction with the accompanying drawings, illustrating by way of example the principles of the invention.

DETAILED DESCRIPTION

Figure 1:
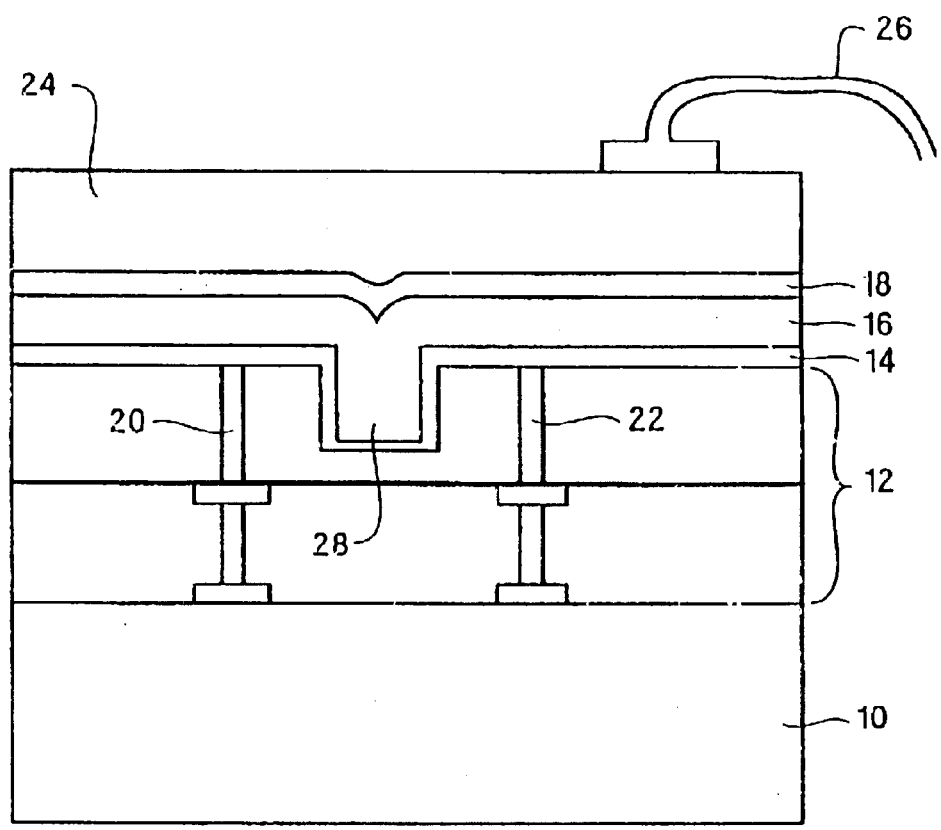
FIG. 1 shows a cross-section of a prior art array of image sensors.

As shown in the drawings for purposes of illustration, the invention is embodied in an elevated image sensor array adjacent to a substrate which includes isolation between the image sensors. The ion implantation regions provide physical isolation between image sensors. The physical isolation reduces coupling and cross-talk between the image sensors. The array of isolated image sensors can be formed by a simple fabrication process.

Figure 2:
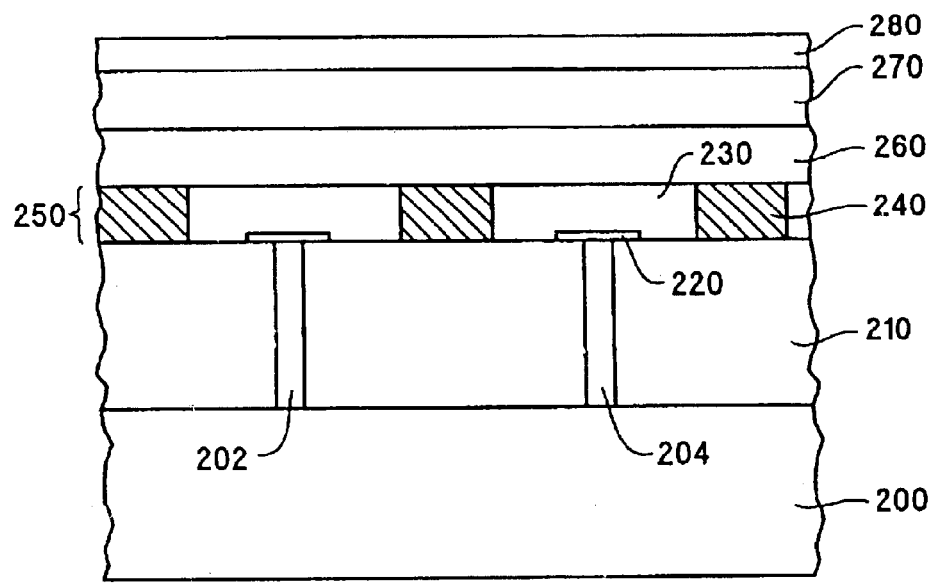
FIG. 2 shows an embodiment of the invention.

FIG. 2 shows a first embodiment of the invention. This embodiment includes a substrate 200. An interconnection structure 210 is formed adjacent to the substrate 200. Inner metal sections 220 are formed adjacent to the interconnect structure 210. An electrode layer 250 is formed adjacent to the interconnect structure 210. The electrode layer 250 covers the inner metal sections 220. The electrode layer 250 includes electrode ion implantation regions 240 and pixel electrodes 230. The locations of the electrode ion implantation regions 240 define the locations of the pixel electrodes 230. The electrode ion implantation regions 240 provide physical isolation between the pixel electrodes 230. The pixel electrodes 230 form cathodes of an array of image sensors.

This embodiment further includes an inner layer 260 adjacent to the electrode layer 250, and an outer layer 270 adjacent to the inner layer 260. A transparent conductor 280 is adjacent to the outer layer 270. Each image sensor of the array of image sensors includes an individual inner metal section 220 and a pixel electrode 230.

The pixel electrode 230 of a first image sensor is electrically connected to the substrate 200 through a first conductive via 202. The pixel electrode 230 of a second image sensor is electrically connected to the substrate 200 through a second conductive via 204.

The image sensors conduct charge when the image sensors receive light. The substrate 200 generally includes sense circuitry and signal processing circuitry. The sense circuitry senses how much charge the image sensors have conducted. The amount of charge conducted represents the intensity of light received by the image sensors. Generally, the substrate 200 can be CMOS (complementary metal oxide silicon), BiCMOS or Bipolar. The substrate 200 can include various types of substrate technology including charged coupled devices.

Typically, the interconnection structure 210 is a standard CMOS interconnection structure. The structure and methods of forming this interconnection structure 210 are well known in the field of electronic integrated circuit fabrication. The interconnection structure 210 can be a subtractive metal structure, or a single or dual damascene structure.

The conductive vias 202, 204 pass through the interconnect structure 210 and electrically connect the pixel electrodes 230 to the substrate 200. Typically, the conductive vias 202, 204 are formed from tungsten. Tungsten is generally used during fabrication because tungsten can fill high aspect ratio holes. That is, tungsten can be used to form narrow and relatively long interconnections. Typically, the conductive vias 202, 204 are formed using a chemical vapor deposition (CVD) process. Other materials which can be used to form the conductive vias 202, 204 include copper, aluminum or any other electrically conductive material.

There are several structural advantages to having the pixel interconnect structure 210 between the pixel electrodes 230 and the substrate 200. This structure allows the interconnection circuitry to be tightly packed. First of all, lateral space is conserved because the vias 202, 204 are located directly underneath the pixel electrodes. Secondly, the structure allows the formation of vias 202, 204 having a minimal diameter. CVD processes are generally the best method of forming the vias 202, 204. A Tungsten CVD process allows for the formation of small diameter vias. However, the temperatures required to form tungsten vias with a CVD process are greater than many of the materials (amorphous silicon for example) to form the pixel electrodes can withstand. By forming the pixel interconnect structure 210 over the substrate 200, and the pixel electrodes 220 over the pixel interconnect structure 210, the vias 202, 204 can be formed before the pixel electrodes 220, and therefore, the pixel electrodes 230 are not subjected to the high temperatures required for the formation of the vias 202, 204.

The inner metal sections 220 should include a thin conductive material. The inner metal sections 220 may be formed, for example, from a degenerately doped semiconductor layer, aluminum, titanium, titanium nitride, copper or tungsten. The inner metal sections 220 should be thin (approximately 500 Angstroms) and smooth. The inner metal sections 220 should be smooth enough that any surface roughness is substantially less than the thickness of the pixel electrodes 230 formed over the inner metal sections 220. To satisfy the smoothness requirement, polishing of the inner metal sections 220 may be required.

The inner metal sections 220 can be optional. However, the inner metal sections 220 have a lower resistance than the materials used to form the pixel electrodes 230. Therefore, the inner metal sections 220 provide better current collection.

The amorphous silicon electrode layer 250 includes both the pixel electrodes 230 and the electrode ion implantation regions 240. The electrode layer 250 is generally formed from a doped semiconductor. The doped semiconductor can be an N-layer of amorphous silicon.

The electrode layer is typically deposited using plasma etched chemical vapor deposition (PECVD). A silicon containing gas (such as $Si_2H_6$ or $SiH_4$) is included when forming an amorphous silicon electrode layer 250. When forming an N-layer electrode layer 250, the PECVD process is performed with a phosphorous containing gas (such as $PH_3$).

The electrode ion implantation regions 240 are formed according to a predetermined pattern. The electrode ion implantation regions 240 define the pixel electrodes 230, and provide physical isolation between the pixel electrodes 230. Ion implantation regions have been used for providing electrical isolation between active devices, but not for the purpose of providing physical isolation between image sensors of an array of image sensors. Elements which can be implanted to provide the electrode ion implantation regions 240 include N, Ar, O, B, F and C. Etched Si or Ge can also serve as electrode ion implantation regions 240. Isolation is provided by further amorphizing an alpha silicon layer (the electrode layer) between the image sensors (pixels). The etched Si or Ge, or ion implantation regions 240 disrupt the short range order of the amorphous silicon to prevent conduction of holes and electrons in the disrupted areas.

The ion implantation regions 240 are typically formed by coating a resist on the amorphous silicon electrode layer 250, and removing the resist according to a predetermined pattern where the ion implantation regions 240 are to be formed. Methods of coating and selectively removing resist are well known in the art of semiconductor processing. Ions are then implanted in the exposed regions of the amorphous silicon electrode layer 250. Methods of implanting ions are also well known in the art of semiconductor processing.

The pixel electrodes 230 must be thick enough, and doped heavily enough that the pixel electrodes 230 do not fully deplete when biased during operation. The pixel electrodes 230 are typically doped with phosphorous.

An N-layer of amorphous silicon is typically used electrode layer 250 when forming PIN diode image sensors. However, the diode image sensors can include an NIP sensor configuration. In this case, the electrode layer 250 is formed from a P-layer.

The inner layer 260 is typically an I-layer which is formed from hydrogenated amorphous silicon. The I-layer can be deposited using a PECVD process or a reactive sputtering process. The PECVD process must include a silicon containing gas. The deposition should be at a low enough temperature that hydrogen is retained within the film. The I-layer is typically on the order of one micron thick.

The outer layer 270 is typically a P-layer 270 which is formed from amorphous silicon. Typically, the P-layer is doped with Boron.

The P-layer can deposited using a PECVD process. The PECVD process is performed with a Boron containing gas. The Boron containing gas can be $B_2H_6$. A silicon containing gas is included when forming an amorphous silicon P-layer. The thickness of the P-layer must generally be controlled to ensure that the P-layer does not absorb too much short wavelength (blue) light.

Another embodiment of the invention does not include the P-layer outer layer 270. The P-layer can be eliminated with proper selection of the composition of the material within the transparent conductor 280, and proper selection of the doping levels of the pixel electrodes 230. For this embodiment, the transparent conductor 280 provides an electrical connection between a top surface of the I-layer inner section 260 of the image sensors and the interconnection structure 210.

As previously described, the pixel electrodes 230, the inner layer 260 and the outer layer 270 are generally formed from amorphous silicon. However, the pixel electrodes 230, the inner layer 260 and the outer layer 270 can also be formed from amorphous carbon, amorphous silicon carbide, amorphous germanium, or amorphous silicon-germanium. It should be understood that this list is not exhaustive.

The transparent conductor 280 provides a conductive connection between anodes of the image sensors (typically the outer layer 270) and the interconnection structure 210. Light must pass through the transparent conductor 280 which is received by the image sensors. Generally, the transparent conductor 280 is formed from an indium tin oxide. However, the transparent conductor 280 can also be formed from titanium nitride, thin silicide, or certain types of transition metal nitrides or oxides.

Both the selection of the type of material to be used within the transparent conductor 280, and the determination of the desired thickness of the transparent conductor 280, are based upon minimizing the optical reflection of light received by the image sensor. Minimization of the reflection of light received by the image sensor helps to optimize the amount of light detected by the image sensor.

The transparent conductor 280 can be deposited by a sputtering process. Deposition through sputtering is well known in the art of integrated circuit fabrication.

A protective layer may be formed over the transparent conductor 280. The protective layer provides mechanical protection, electrical insulation, and can provide some anti-reflective characteristics.

Figure 3:
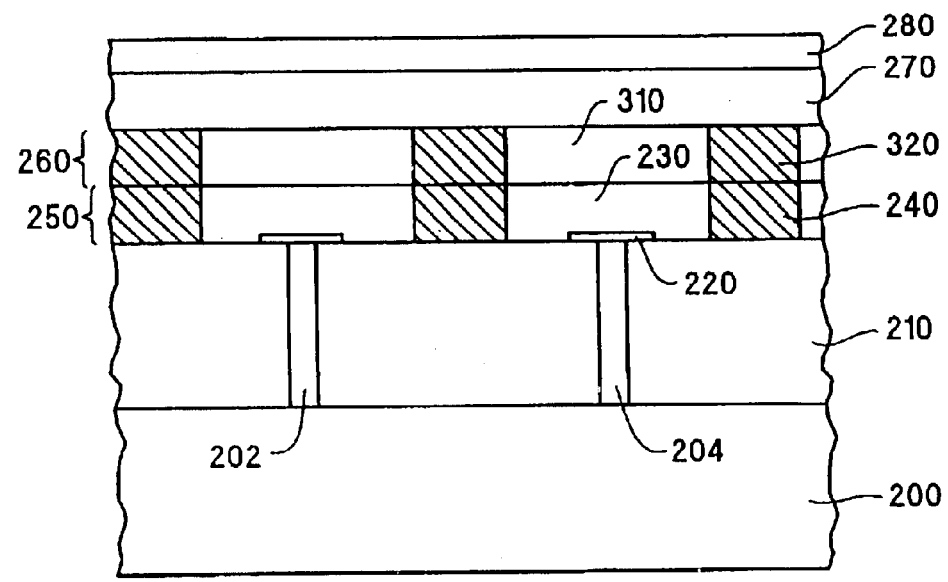
FIG. 3 shows another embodiment of the invention.

FIG. 3 shows another embodiment of the invention. For this embodiment, rather than several image sensors sharing an inner layer 260 I-layer, each image sensor includes an individual I-layer section 310. That is, each PIN diode sensor image sensors includes a separate I-layer section 310.

Similar to the pixel electrodes 230, the I-layer sections 310 are formed between I-layer ion implantation regions 320. The I-layer ion implantation regions 320 are generally formed according to the same predetermined pattern as the electrode ion implantation regions 240. The I-layer ion implantation regions 320 define the I-layer sections 310, and provide physical isolation between the I-layer sections 310. Ion implantation regions have been used for providing electrical isolation between active devices, but not for the purpose of providing physical isolation between image sensors of an array of image sensors. Elements which can be implanted to provide the I-layer ion implantation regions 320 include N, Ar, O, B, F and C. Etched Si or Ge can also serve as I-layer ion implantation regions 320. Isolation is provided by further amorphizing an alpha silicon layer (the inner layer 260) between the image sensors (pixels). The etched Si or Ge, or ion implantation regions 240 disrupt the short range order of the amorphous silicon to prevent conduction of holes and electrons in the disrupted areas.

The method of forming the I-layer ion implantation regions 320 can be the same as the method of forming the ion implantation regions 240 as described above.

Figure 4:
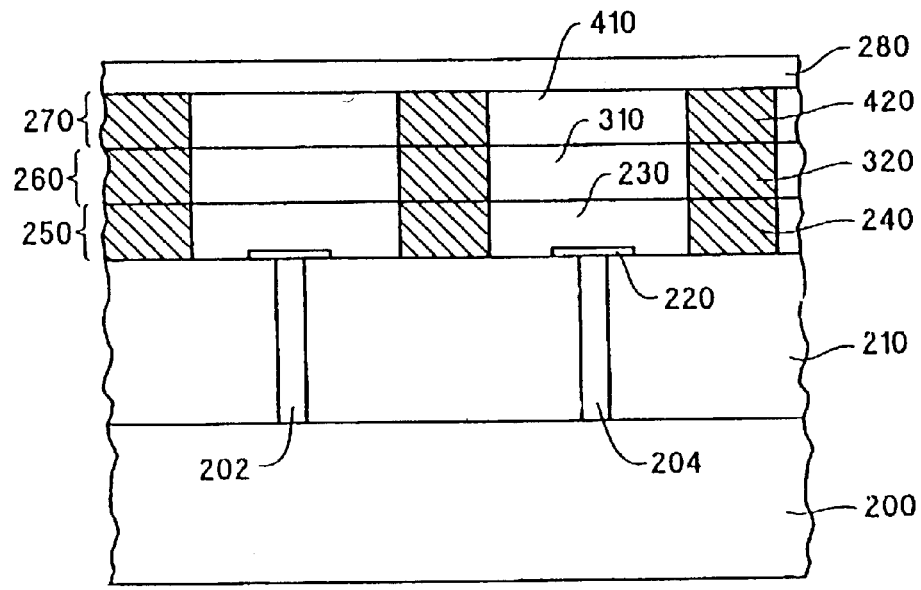
FIG. 4 shows another embodiment of the invention.

FIG. 4 shows another embodiment of the invention. For this embodiment, rather than several image sensors sharing an outer layer 270 P-layer, each image sensor includes an individual P-layer section 410. That is, each PIN diode sensor image sensor includes a separate P-layer section 410.

Similar to the pixel electrodes 230, the P-layer sections 410 are formed between P-layer ion implantation regions 420. The P-layer ion implantation regions 420 are generally formed according to the same predetermined pattern as the electrode ion implantation regions 240. The P-layer ion implantation regions 420 define the P-layer sections 410, and provide physical isolation between the P-layer sections 410. Ion implantation regions have been used for providing electrical isolation between active devices, but not for the purpose of providing physical isolation between image sensors of an array of image sensors. Elements which can be implanted to provide the P-layer ion implantation regions 420 include N, Ar, O, B, F and C. Etched Si or Ge can also serve as P-layer ion implantation regions 420. Isolation is provided by further amorphizing an alpha silicon layer (the outer layer 270) between the image sensors (pixels). The etched Si or Ge, or ion implantation regions 240 disrupt the short range order of the amorphous silicon to prevent conduction of holes and electrons in the disrupted areas.

The method of forming the P-layer ion implantation regions 420 can be the same as the method of forming the ion implantation regions 240 as described above.

Figure 5:
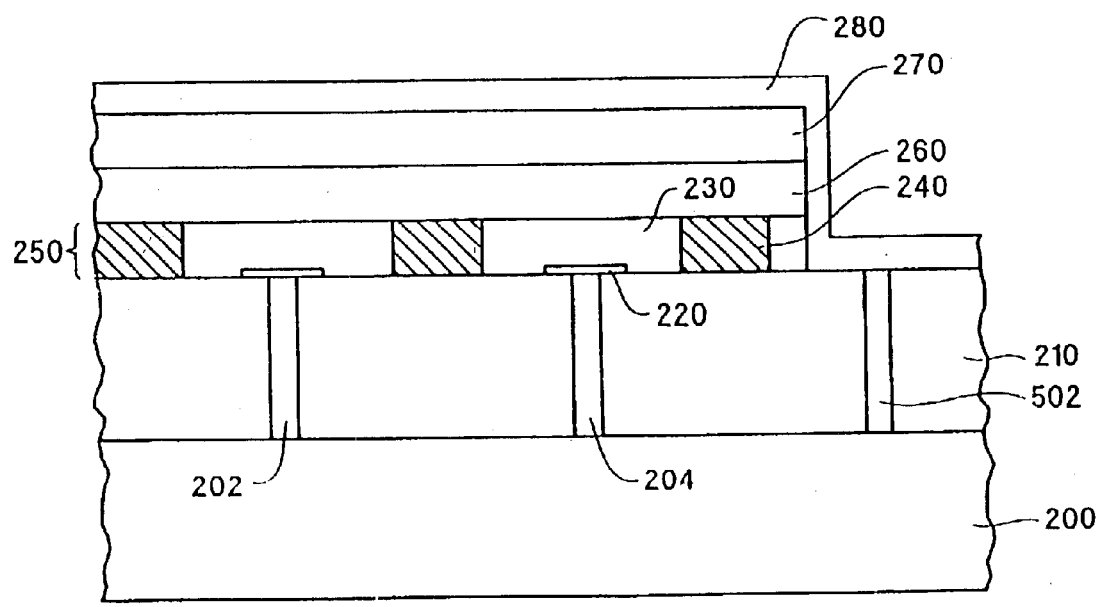
FIG. 5 shows another embodiment of the invention.

FIG. 5 shows another embodiment of the invention. This embodiment includes an inner surface of the transparent conductor 280 being electrically connected to the substrate 200 through a third conductive via 502. The embodiment shown in FIG. 5 only includes the pixel electrodes 230 and electrode ion implantation regions 240 of the electrode layer 250. However, the I-layer sections 310 and I-layer ion implantation regions 320 of the inner layer 260 I-layer of FIG. 3 can be included. Additionally, the P-layer sections 410 and P-layer ion implantation regions 420 of the outer layer 270 P-layer of FIG. 4 can also be included.

FIGS. 6–11 show processing steps which can be used to fabricate the embodiments of the invention shown in FIG. 2 and FIG. 5.

Figure 6:
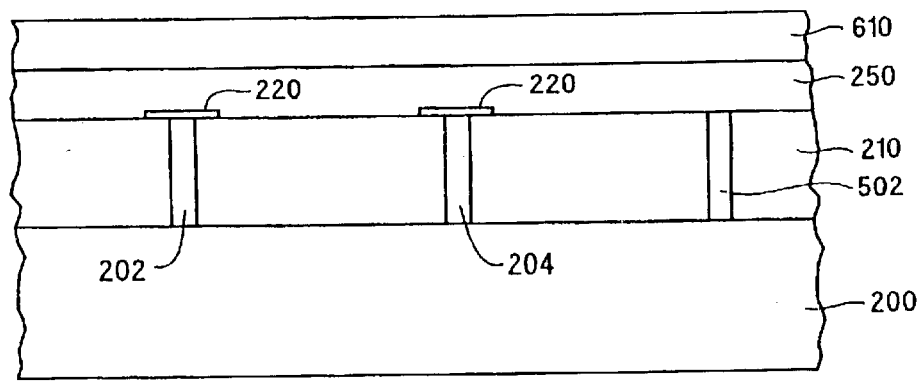
FIGS. 6–11 show processing steps which can be used to fabricate the embodiments of the invention shown in FIG. 2 and FIG. 5.

FIG. 6 shows a substrate 200 with a standard interconnect structure 210 formed over the substrate 200. Inner metal layer sections 220, an electrode layer 250 and a photo-resist layer 610 are deposited over the interconnect structure 210.

The structure and methods of forming this interconnect structure 210 are well known in the field of electronic integrated circuit fabrication. The interconnect structure 210 can be a subtractive metal structure, or a single or dual damascene structure.

The pixel interconnect structure 210 includes conductive vias 202, 204, 502. Generally, the conductive vias 202, 204, 502 are formed from tungsten. Tungsten is generally used because during fabrication, tungsten can fill high aspect ratio holes. That is, tungsten can be used to form narrow and relatively long interconnections. Typically, the conductive vias 202, 204, 502 are formed using a chemical vapor deposition (CVD) process. Other materials which can be used to form the conductive vias 202, 204, 502 include copper, aluminum or any other electrically conductive material.

The inner metal layer 60 is typically deposited by a sputtering process.

As previously stated, the electrode layer 250 is typically deposited using plasma etched chemical vapor deposition (PECVD). A silicon containing gas (such as $Si_2H_6$ or $SiH_4$) is included when forming an amorphous silicon electrode layer 250. When forming an N-layer electrode layer 250, the PECVD process is performed with a phosphorous containing gas (such as $PH_3$).

The photo-resist layer 610 is deposited over the interconnect structure 210. Deposition of photo-resist 610 is a process which is well understood in the art of semiconductor processing.

Figure 7:
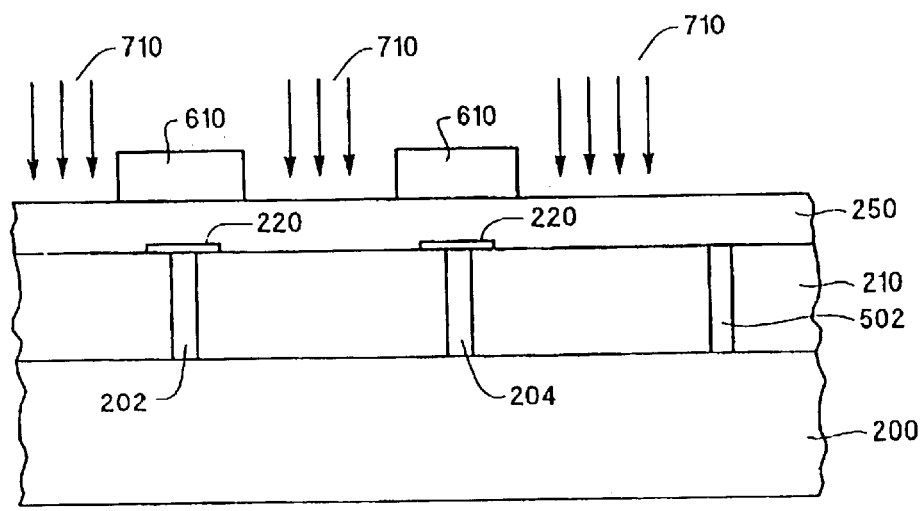

FIG. 7 shows the photo-resist 610 in which a predetermined pattern of the photo-resist have been removed. The islands of photo-resist which are not removed, define the locations of the pixel electrodes 230 of the electrode layer 250. the portions of photo-resist which have been removed define the locations of the electrode implantation regions 240. Methods of removing photo-resist are well known in the art of semiconductor processing.

The arrows 710 of FIG. 7 show where the ions of the select group of materials are implanted. As previously mentioned, the materials which can be implanted include N, Ar, O, B, F and C. Etched Si or Ge can also serve as electrode ion implantation regions 240.

Figure 8:
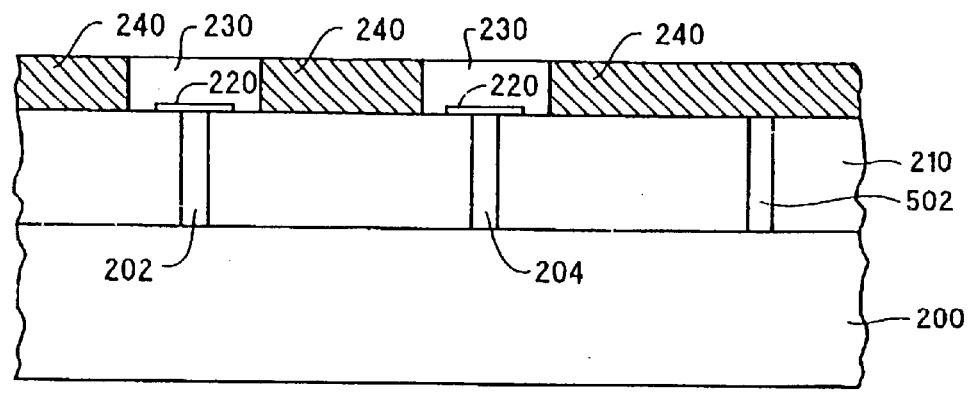

FIG. 8 shows the patterned photo-resist layer having been removed. FIG. 8 also shows the pixel electrodes 230 and the electrode ion implantation regions 240.

Figure 9:
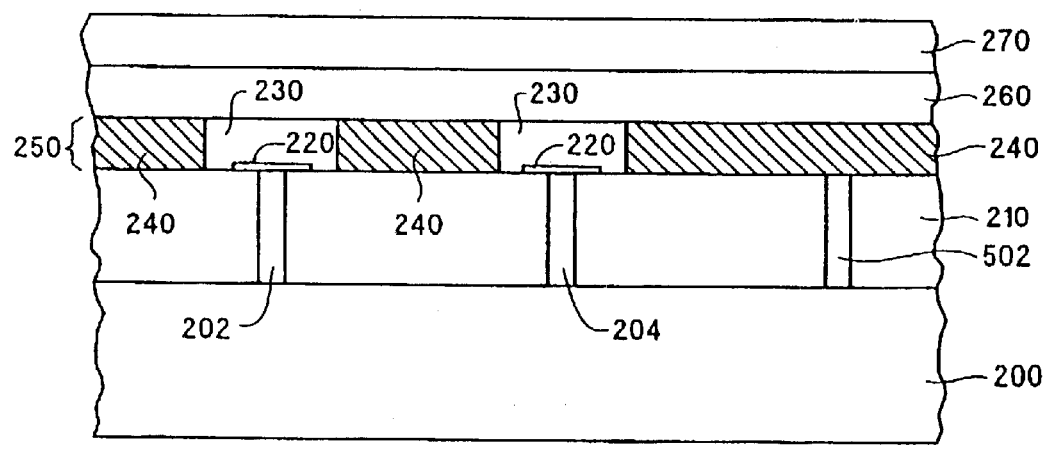

FIG. 9 shows the inner layer 260 and the outer layer 270 having been deposited over the electrode layer 250. As previously stated, the inner layer 260 is typically an I-layer, and the outer layer 270 is typically a P-layer. The structure shown in FIG. 9 is similar to the embodiment of FIG. 2. Deposition of a transparent conductor 280 over the structure shown in FIG. 9 results in the embodiment shown in FIG. 2.

The I-layer is generally deposited using a PECVD process or reactive sputtering process. The PECVD process must include a silicon containing gas. The deposition should be at a low enough temperature that hydrogen is retained within the film.

The P-layer can also be deposited using a PECVD process. The PECVD process is performed with a Boron containing gas. The Boron containing gas can be $B_2H_6$. A silicon containing gas is included when forming an amorphous silicon P-layer.

Figure 10:
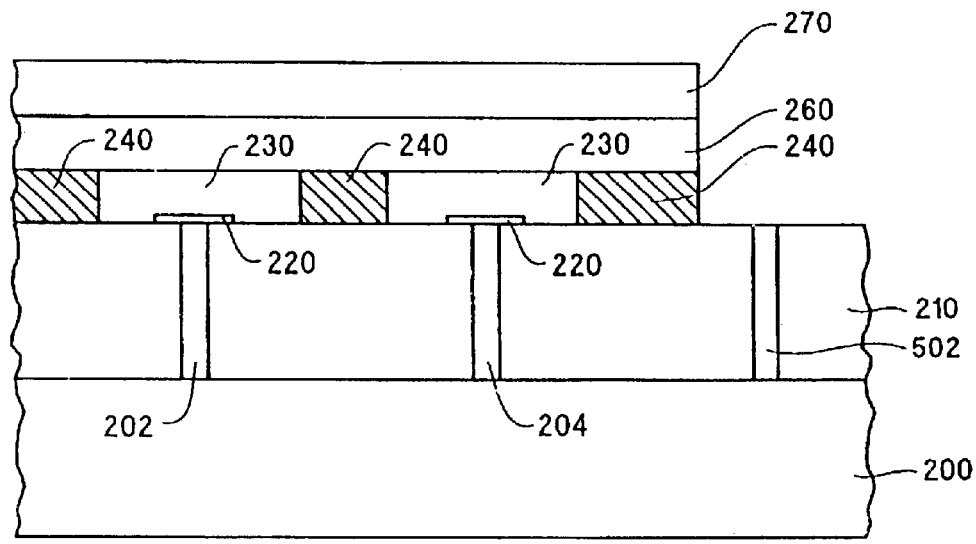

FIG. 10 shows the the electrode layer 250, the inner layer 260 and the outer layer 270 having been wet or dry etched according to a predetermined pattern to allow access to the third conductive via 502.

Figure 11:
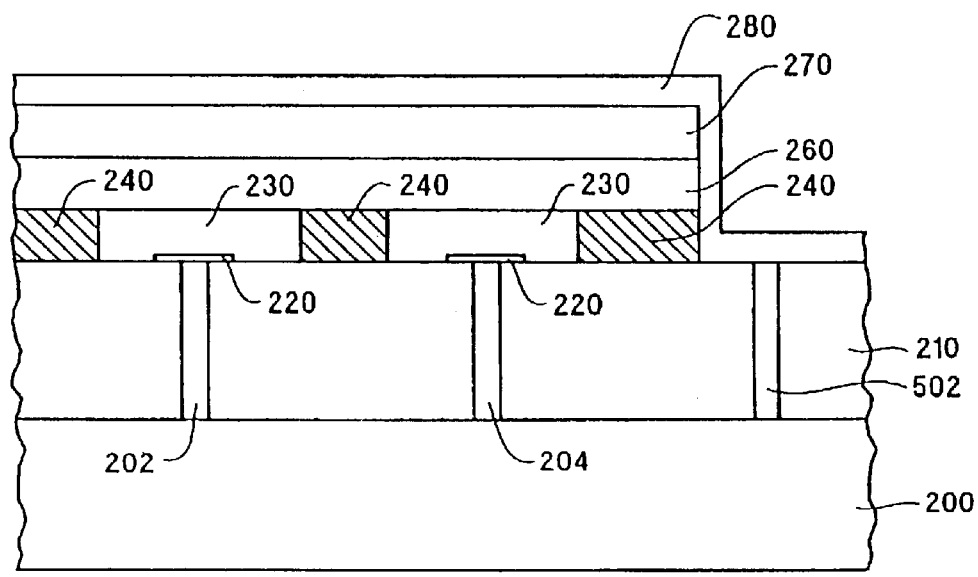

FIG. 11 shows the transparent conductive layer 280 deposited over the outer layer 270. The transparent conductive layer 280 provides an electrical connection between the outer layer 270 and the conductive via 56. Generally, the transparent conductor 280 is formed from an indium tin oxide. However, the transparent conductor 280 can also be formed from titanium nitride, thin silicide, or certain types of transition metal nitrides or oxides.

The transparent conductive layer 280 is generally deposited through reactive sputtering. However, the transparent conductive layer 280 can also be grown by evaporation. If the transparent conductive layer 280 is formed from titanium nitride, then typically a CVD process or a sputtering process must be used to deposit the transparent conductive layer 280.

As stated previously, a protective layer may be formed over the transparent conductor 280. The protective layer provides mechanical protection, electrical insulation, and can provide some anti-reflective characteristics.

Figure 12:
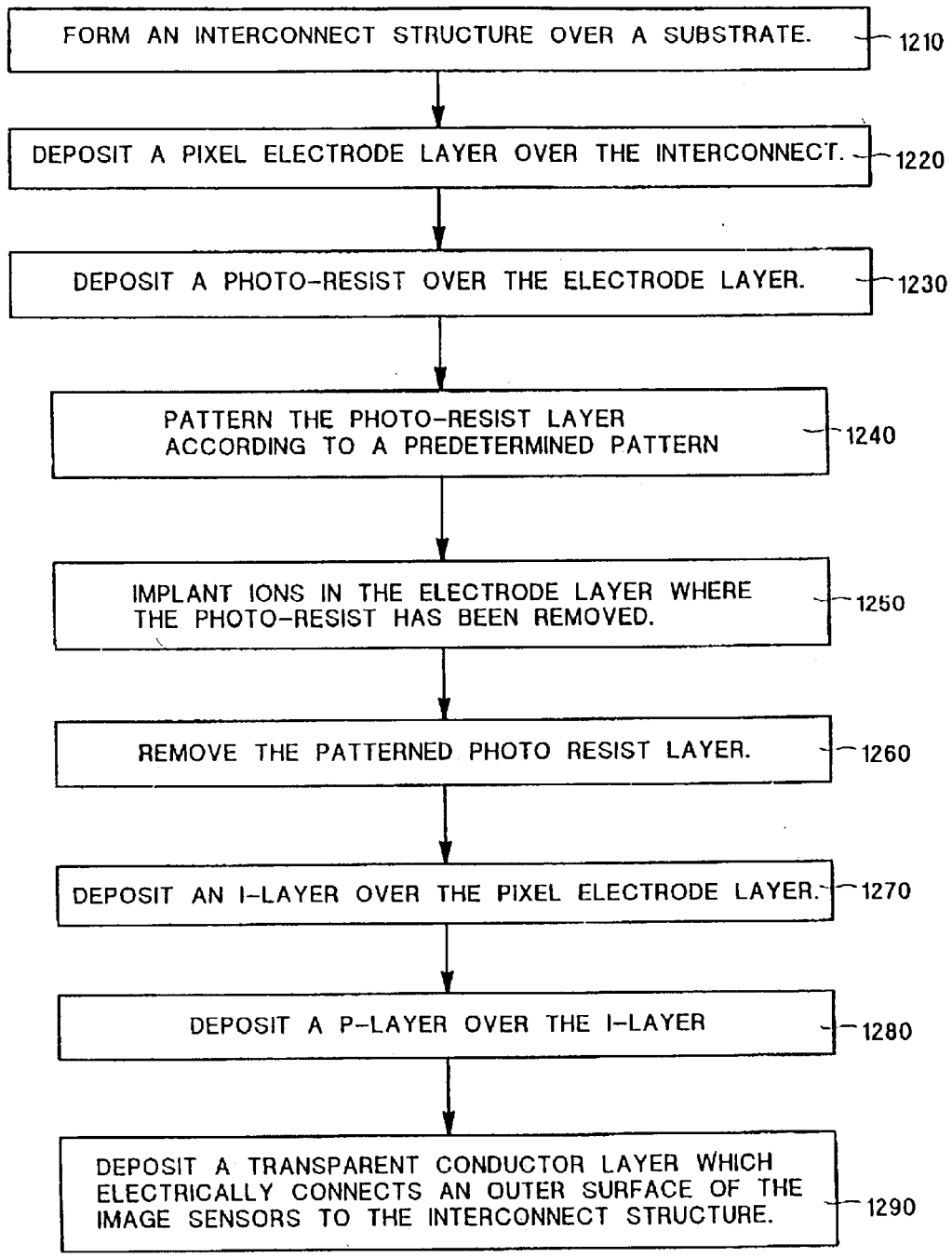
FIG. 12 is a flow chart showing the steps of a method of forming the embodiments of the invention.

FIG. 12 is a flow chart showing the steps of a method of forming the embodiments of the invention. A first step 1210 includes forming an interconnect structure over a substrate. A second step 1220 includes depositing a pixel electrode layer over the interconnect structure. A third step 1230 includes depositing a photo-resist over the electrode layer. A fourth step 1240 includes patterning the photo-resist layer according to a predetermined pattern. A fifth step 1250 includes implanting ions in the electrode layer where the photo-resist has been removed. A sixth step 1260 includes removing the patterned photo-resist layer. A seventh step 1270 includes depositing a I-layer over the pixel electrode layer. An eighth step 1280 includes depositing a P-layer over the I-layer. Finally, a ninth step 1290 includes depositing a transparent conductor layer electrically connecting the outer surface of the image sensors to the interconnect structure.

The third step 1230, the fourth step 1240, and the fifth step 1250 can be repeated for both the I-layer and the P-layer to form the I-layer implantation regions and the P-layer implantation regions.

Although specific embodiments of the invention have been described and illustrated, the invention is not to be limited to the specific forms or arrangements of parts so described and illustrated. The invention is limited only by the claims.

What is claimed:

1. An image sensor array device comprising:
   a substrate;
   an interconnect structure adjacent to the substrate;
   an amorphous silicon electrode layer adjacent to the interconnect structure, the amorphous silicon electrode layer comprising ion implantation regions between pixel electrode regions, the pixel electrode regions defining electrode of an array of image sensors, the electrode ion implantation regions providing physical isolation between the pixel electrode regions, the electrode electrically connected to the interconnect structure;

a continuous amorphous silicon I-layer adjacent to the amorphous silicon electrode layer, the amorphous silicon I-layer forming an inner layer of each of the image sensors; and a transparent electrode layer formed adjacent to the image sensors, an inner surface of the transparent electrode electrically connected to anodes of the image sensors and the interconnect structure.

2. The image sensor array as recited in claim 1, wherein the amorphous silicon I-layer region comprises I-layer ion implantation regions that provide physical isolation between the inner layers of the image sensors, the I-layer ion implantation regions aligning with the electrode ion implantation regions.

3. The image sensor array as recited in claim 1, further comprising an amorphous silicon P-layer adjacent to the amorphous silicon I-layer, the amorphous silicon P-layer forming an outer layer of each of the image sensors.

4. The image sensor array as recited in claim 3, wherein the amorphous silicon P-layer region comprises P-layer ion implantation regions that provide physical isolation between the outer layers of the image sensors.

5. The image sensor array as recited in claim 1, wherein the amorphous silicon electrode layer comprises an N-layer.

6. The image sensor array as recited in claim 1, wherein the interconnect structure electrically interconnects the pixel electrode regions to the substrate.

7. The image sensor array as recited in claim 1, wherein the inner surface of the transparent electrode is electrically connected to the interconnect structure through a tungsten plug.

8. The image sensor array as recited in claim 1, wherein the transparent electrode comprises indium tin oxide.

9. The image sensor array as recited in claim 1, wherein the substrate comprises CMOS.

10. The image sensor array as recited in claim 1, wherein the substrate comprises active circuits which sense charge accumulated by the image sensors due to the image sensors receiving light.

11. The image sensor array as recited in claim 1, wherein the substrate comprises charge coupled devices.

12. The image sensor array as recited in claim 1, wherein the inner surface of the transparent electrode is electrically connected to the interconnect structure through a plurality of tungsten plugs.

13. The image sensor array as recited in claim 1, wherein implantation regions comprise Boron implants.

14. The image sensor array as recited in claim 1, wherein implantation regions comprise Arsenic implants.

15. The image sensor array as recited in claim 1, wherein implantation regions comprise Phosphorous implants.

16. The image sensor array as recited in claim 1, wherein implantation regions comprise oxygen implants.

17. An image sensor array device comprising:

a substrate;

an interconnect structure adjacent to the substrate;

an amorphous silicon electrode layer adjacent to the interconnect structure, the amorphous silicon electrode layer comprising electrode ion implantation regions between pixel electrode regions whereby depletion region is formed at junctions between the pixel electrode regions and the ion implantation regions, the pixel electrode regions defining electrode of an array of image sensors, the electrode electrically connected to the interconnect structure;

a amorphous silicon I-layer adjacent to the amorphous silicon electrode layer, the amorphous silicon I-layer forming an inner layer of each of the image sensors; and a transparent electrode layer formed adjacent to the image sensors, an inner surface of the transparent electrode electrically connected to anodes of the image sensors and the interconnect structure.

18. The image sensor arrray as recited in claim 17, wherein the amorphous silicon I-layer region comprises I-layer ion implantation regions that provide physical isolation between the inner layers of the images sensors, the I-layer ion implantation regions aligning with the electrode ion implantation regions.

19. The image sensor array as recited in claim 17, further comprising an amorphous silicon P-layer adjacent to the amorphous silicon I-layer, the amorphous silicon P-layer forming an outer layer of each of the image sensors.

20. The image sensor array as recited in claim 19, wherein the amorphous silicon P-layer region comprises P-layer ion implantation regions that provide physical isolation between the outer layers of the image sensors.

21. The image sensor array as recited in claim 17, wherein the amorphous silicon electrode layer comprises an N-layer.

22. The image sensor array as recited in claim 17, wherein the interconnect structure electrically interconnects the pixel electrode regions to the substrate.

23. The image sensor array as recited in claim 17, wherein the inner surface of the transparent electrode is electrically connected to the interconnect structure through a tungsten plug.

24. The image sensor array as recited in claim 17, wherein the transparent electrode comprises indium tin oxide.

25. The image sensor array as recited in claim 17, wherein the substrate comprises CMOS.

26. The image sensor array as recited in claim 17, wherein the substrate comprises active circuits which sense charge accumulated by the image sensors due to the image sensors receiving light.

27. The image sensor array as recited in claim 17, wherein the substrate comprises charge coupled devices.

28. The image sensor array as recited in claim 17, wherein the inner surface of the transparent electrode is electrically connected to the interconnect structure through a plurality of tungsten plugs.

29. The image sensor array as recited in claim 17, wherein implantation regions comprise Boron implants.

30. The image sensor array as recited in claim 17, wherein implantation regions comprise Phosphorous implants.

31. The image sensor array as recited in claim 17, wherein implantation regions comprise Arsenic implants.

32. The image sensor array as recited in claim 17, wherein implantation regions comprise oxygen implants.

* * * * *